(12) United States Patent
Atsumi et al.

(10) Patent No.: US 9,921,772 B2
(45) Date of Patent: Mar. 20, 2018

(54) SEMICONDUCTOR MEMORY DEVICE THAT RANDOMIZES DATA AND RANDOMIZER THEREOF

(71) Applicant: TOSHIBA MEMORY CORPORATION, Tokyo (JP)

(72) Inventors: Tsuyoshi Atsumi, Ota Tokyo (JP); Yasuhiko Kurosawa, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/253,757

(22) Filed: Aug. 31, 2016

(65) Prior Publication Data
US 2017/0160939 A1    Jun. 8, 2017

(30) Foreign Application Priority Data

Dec. 4, 2015 (JP) ................................. 2015-237706

(51) Int. Cl.
*G11C 7/10* (2006.01)
*G06F 3/06* (2006.01)
(Continued)

(52) U.S. Cl.
CPC ............ *G06F 3/064* (2013.01); *G06F 3/0619* (2013.01); *G06F 3/0679* (2013.01); *G06F 7/58* (2013.01); *G11C 7/1006* (2013.01); *G11C 7/1036* (2013.01); *G11C 16/10* (2013.01); *G11C 16/349* (2013.01)

(58) Field of Classification Search
CPC ....... G11C 7/1036; G11C 27/04; G11C 29/20; G06F 3/064; G06F 7/58; G06F 3/0619; G06F 3/0679
See application file for complete search history.

(56) References Cited

U.S. PATENT DOCUMENTS 4,051,460 A * 9/1977 Yamada ................. G11C 29/20
                                                    711/115
5,033,048 A * 7/1991 Pierce .................... G11C 29/20
                                                    708/252
(Continued)

FOREIGN PATENT DOCUMENTS

JP    2012226822 A    11/2012
JP    2013021461 A    1/2013
(Continued)

*Primary Examiner* — Khamdan Alrobaie
(74) *Attorney, Agent, or Firm* — Patterson & Sheridan, LLP

(57) ABSTRACT

A semiconductor memory device includes a NAND memory including a plurality of blocks, each of which is a unit of data erasing, and a controller. The controller is configured to select an initial value from a group of initial values, based on an address of the NAND memory in which data are to be written, set a value corresponding to the selected initial value to a linear feedback shift register circuit, randomize the data using an output value of the linear feedback shift register circuit, and write the randomized data to the address of the NAND memory. A size of each of the blocks S is smaller than $2^{n-1}$ bytes, n being a number of registers included in the linear feedback shift register circuit.

10 Claims, 12 Drawing Sheets

(51) Int. Cl.
*G06F 7/58* (2006.01)
*G11C 16/10* (2006.01)
*G11C 16/34* (2006.01)

(56) References Cited

U.S. PATENT DOCUMENTS

| | | | | |
|---|---|---|---|---|
| 5,566,099 A | * | 10/1996 | Shimada | G06F 7/582 |
| | | | | 331/78 |
| 5,615,348 A | * | 3/1997 | Koino | G06F 9/30043 |
| | | | | 711/165 |
| 8,996,792 B2 | | 3/2015 | Mun et al. | |
| 9,191,030 B2 | | 11/2015 | Sakata et al. | |
| 2002/0194557 A1 | * | 12/2002 | Park | G11C 29/20 |
| | | | | 714/718 |
| 2014/0146607 A1 | * | 5/2014 | Nagai | G06F 7/58 |
| | | | | 365/185.04 |
| 2015/0100614 A1 | * | 4/2015 | Ueda | H03K 3/84 |
| | | | | 708/250 |

FOREIGN PATENT DOCUMENTS

| | | |
|---|---|---|
| JP | 2013073664 A | 4/2013 |
| JP | 2013137708 A | 7/2013 |

\* cited by examiner

FIG. 3

| INDEX | INITIAL VALUE | | INDEX | INITIAL VALUE |
|---|---|---|---|---|
| 0 | 00000001 | | 34 | e570fbe0 |
| 1 | 9489ba62 | | 35 | fc888e03 |
| 2 | 4963ae34 | | 36 | 9137909a |
| 3 | d8aa9eca | | 37 | e78928ba |
| 4 | c16134c9 | | 38 | af42586d |
| 5 | 814fb74f | | 39 | dc62791a |
| 6 | f51a001e | | 40 | c1ea853d |
| 7 | 348363d0 | | 41 | 7962cbab |
| 8 | e6f7cc7a | | 42 | 8d04507d |
| 9 | d2e8d2e5 | | 43 | 993bd80b |
| 10 | d17bf247 | | 44 | 23c1ea96 |
| 11 | c2fb03d3 | | 45 | cc10c634 |
| 12 | 37ab64c8 | | 46 | b4f57180 |
| 13 | 547fc47d | | 47 | 8b82f22f |
| 14 | fdaaaaa9 | | 48 | 21a12e28 |
| 15 | 364bfe75 | | 49 | 121e5cdc |
| 16 | 3f52dcc6 | | 50 | 7d52b96a |
| 17 | e67b1b43 | | 51 | 650e025c |
| 18 | 1db3d22d | | 52 | 27129d3e |
| 19 | cdb9309f | | 53 | 5f4daed5 |
| 20 | 0a99fba9 | | 54 | b1644f81 |
| 21 | 7bddf962 | | 55 | 888cc660 |
| 22 | e06427b7 | | 56 | d10ba513 |
| 23 | 9b963ca3 | | 57 | d46db956 |
| 24 | 15f31077 | | 58 | c1e3077e |
| 25 | f7fa1f7a | | 59 | 50a670f1 |
| 26 | 8eddd13f | | 60 | 0b945a65 |
| 27 | 49487e21 | | 61 | b874ad1d |
| 28 | 45a110be | | 62 | 32673916 |
| 29 | 79dab490 | | 63 | 1c79c97c |
| 30 | 370d8e70 | | 64 | 3818a21e |
| 31 | e7aacbf8 | | 65 | 40fdd5bb |
| 32 | 26cfaecf | | 66 | 68ad234b |
| 33 | a9f88671 | | | |

FIG. 7A

| shiftnum | offset 0 | 1 | 2 | 3 |
|---|---|---|---|---|
| 0 | 0 | 1 | 2 | 3 |
| 1 | 5 | 6 | 7 | 8 |
| 2 | 10 | 11 | 12 | 13 |
| 3 | 15 | 16 | 17 | 18 |
| 4 | 20 | 21 | 22 | 23 |
| 5 | 25 | 26 | 27 | 28 |
| 6 | 30 | 31 | 32 | 33 |
| 7 | 35 | 36 | 37 | 38 |
| 8 | 40 | 41 | 42 | 43 |
| 9 | 45 | 46 | 47 | 48 |
| 10 | 50 | 51 | 52 | 53 |
| 11 | 55 | 56 | 57 | 58 |
| 12 | 60 | 61 | 62 | 63 |
| 13 | 65 | 66 | 0 | 1 |
| 14 | 3 | 4 | 5 | 6 |
| 15 | 8 | 9 | 10 | 11 |
| 16 | 13 | 14 | 15 | 16 |
| 17 | 18 | 19 | 20 | 21 |
| 18 | 23 | 24 | 25 | 26 |
| 19 | 28 | 29 | 30 | 31 |
| 20 | 33 | 34 | 35 | 36 |
| 21 | 38 | 39 | 40 | 41 |
| 22 | 43 | 44 | 45 | 46 |
| 23 | 48 | 49 | 50 | 51 |
| 24 | 53 | 54 | 55 | 56 |
| 25 | 58 | 59 | 60 | 61 |
| 26 | 63 | 64 | 65 | 66 |
| 27 | 1 | 2 | 3 | 4 |

FIG. 7B

| shiftnum | offset 0 | 1 | 2 | 3 |
|---|---|---|---|---|
| 0 | 0 | 1 | 2 | 3 |
| 1 | 6 | 7 | 8 | 9 |
| 2 | 12 | 13 | 14 | 15 |
| 3 | 18 | 19 | 20 | 21 |
| 4 | 24 | 25 | 26 | 27 |
| 5 | 30 | 31 | 32 | 33 |
| 6 | 36 | 37 | 38 | 39 |
| 7 | 42 | 43 | 44 | 45 |
| 8 | 48 | 49 | 50 | 51 |
| 9 | 54 | 55 | 56 | 57 |
| 10 | 60 | 61 | 62 | 63 |
| 11 | 66 | 0 | 1 | 2 |
| 12 | 5 | 6 | 7 | 8 |
| 13 | 11 | 12 | 13 | 14 |
| 14 | 17 | 18 | 19 | 20 |
| 15 | 23 | 24 | 25 | 26 |
| 16 | 29 | 30 | 31 | 32 |
| 17 | 35 | 36 | 37 | 38 |
| 18 | 41 | 42 | 43 | 44 |
| 19 | 47 | 48 | 49 | 50 |
| 20 | 53 | 54 | 55 | 56 |
| 21 | 59 | 60 | 61 | 62 |
| 22 | 65 | 66 | 0 | 1 |
| 23 | 4 | 5 | 6 | 7 |
| 24 | 10 | 11 | 12 | 13 |
| 25 | 16 | 17 | 18 | 19 |
| 26 | 22 | 23 | 24 | 25 |
| 27 | 28 | 29 | 30 | 31 |
| 28 | 34 | 35 | 36 | 37 |
| 29 | 40 | 41 | 42 | 43 |
| 30 | 46 | 47 | 48 | 49 |
| 31 | 52 | 53 | 54 | 55 |
| 32 | 58 | 59 | 60 | 61 |
| 33 | 64 | 65 | 66 | 0 |
| 34 | 3 | 4 | 5 | 6 |

SEMICONDUCTOR MEMORY DEVICE THAT RANDOMIZES DATA AND RANDOMIZER THEREOF

CROSS-REFERENCE TO RELATED APPLICATION

This application is based upon and claims the benefit of priority from Japanese Patent Application No. 2015-237706, filed Dec. 4, 2015, the entire contents of which are incorporated herein by reference.

FIELD

Embodiments described herein relate generally to a semiconductor memory device that randomizes data to be written and a randomizer thereof.

BACKGROUND

According to a related art, in order to improve reliability of NAND cells, data to be stored in the NAND cells are randomized. To randomize the data, a random number generator may be used. A random number generator of one type employs a linear feedback shift register that has a long period and good number randomness.

DESCRIPTION OF THE DRAWINGS

FIG. 3 illustrates an example of content of a seed table of the randomization processing device.

FIGS. 7A and 7B illustrate a seed table to explain a method of changing a mapping area of indices of the seed table.

DETAILED DESCRIPTION

An embodiment provides a random number generation circuit that can maintain randomness of numbers with a simple circuit configuration.

In general, according to an embodiment, a semiconductor memory device includes a NAND memory including a plurality of blocks, each of which is a unit of data erasing, and a controller. The controller is configured to select an initial value from a group of initial values, based on an address of the NAND memory in which data are to be written, set a value corresponding to the selected initial value to a linear feedback shift register circuit, randomize the data using an output value of the linear feedback shift register circuit, and write the randomized data to the address of the NAND memory. A size of each of the blocks S is smaller than $2^{n-1}$ bytes, n being a number of registers included in the linear feedback shift register circuit.

Hereinafter, random number generation circuits according to embodiments will be described in detail with reference to the accompanied drawings. However, the present disclosure is not limited to such embodiments.

(First Embodiment)

Figure 1:
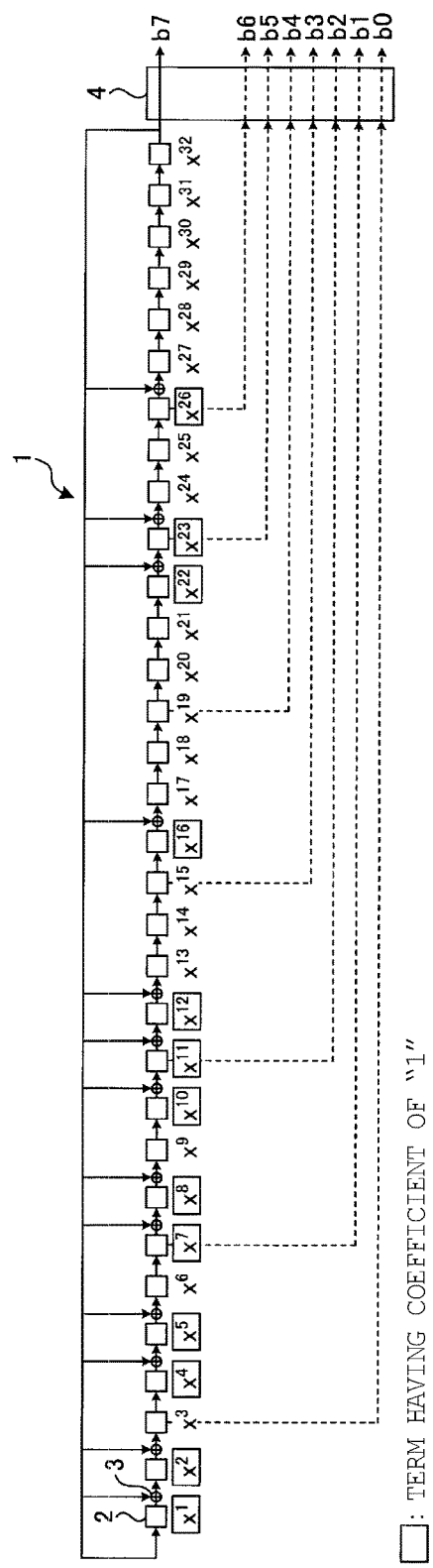
FIG. 1 is a block diagram of a random number generation circuit according to a first embodiment.

FIG. 1 is a block diagram of a random number generation circuit according to a first embodiment. FIG. 1 illustrates a division circuit for an M sequence using a polynomial of the 32nd degree. FIG. 1 illustrates a linear feedback shift register that outputs a remainder obtained by division of an input value using a primitive polynomial of the 32nd degree as a random number. The present embodiment may be applied to a linear feedback shift register that outputs a remainder obtained by division of an input value using a primitive polynomial of the n-th (here, n is an integer or two or more) degree as a random number. The linear feedback shift register may be configured either by hardware or by firmware.

In FIG. 1, a linear feedback shift register 1 includes 32 registers 2 and 13 XOR operation units 3. The linear feedback shift register 1 can output a remainder obtained by division of an input value using a primitive polynomial M(X) of a 32nd degree as a random number. This primitive polynomial M(X), for example, can be expressed by an equation of $M(X)=X^{32}+X^{26}+X^{23}+X^{22}+X^{16}+X^{12}+X^{11}+X^{10}+X^{8}+X^{7}+X^{5}+X^{4}+X^{2}+X^{1}+1$. By using this primitive polynomial M(X), an M sequence can be generated. Using the 32 dimensional primitive polynomial M(X), a pseudo random number can be generated at a period of $2^{32}-1$.

Each of the 32 registers 2 corresponds to one of 32nd terms of the primitive polynomial M(X). An XOR (exclusive OR) circuit 3 is provided at an output terminal of each of the registers 2 corresponding to the terms $X^1, X^2, X^4, X^5, X^7, X^8, X^{10}, X^{11}, X^{12}, X^{16}, X^{22}, X^{23}$, and $X^{26}$ of the primitive polynomial M(X) each having a coefficient of "1". Each XOR circuit 3 calculates XOR of a register output b7 of the linear feedback shift register 1 and a register output from the output terminal of a register 2 located immediately before the XOR circuit 3 and outputs a calculation result to a register 2 following the XOR circuit 3.

The linear feedback shift register 1 also includes a random number output unit 4. The random number output unit 4 outputs k (here, k is an integer of 2 to 13) of 13 XOR calculation results generated on a feedback loop of the linear feedback shift register 1 as k random numbers. The linear feedback shift register 1 can generate 13 XOR operation results for every one cycle for the terms $X^1, X^2, X^4, X^5, X^7, X^8, X^{10}, X^{11}, X^{12}, X^{16}, X^{22}, X^{23}$, and $X^{26}$ of the primitive polynomial M(X) each having a coefficient of "1". FIG. 1 illustrates an example in which the random number output unit 4 outputs b0 to b7 of one byte from eight terms $X^3, X^7, X^{11}, X^{15}, X^{19}, X^{23}$, and $X^{26}$ of the primitive polynomial M(X) as random numbers in every cycle. In addition, the XOR calculation result of the term $X^{12}$ is shifted in order of the term $X^{13} \rightarrow$ the term $X^{14} \rightarrow$ the term $X^{15} \rightarrow$ the term $X^{16}$ for every cycle, and the XOR calculation result of the term $X^{12}$ does not change according to the shift. For this reason, the XOR operation result of the term $X^{12}$ may be taken out from any one of the terms $X^{13}$, $X^{14}$, $X^{15}$, and $X^{16}$.

Also, in FIG. 1, the random number output unit 4 outputs b0 to b7 from the terms $X^3$, $X^7$, $X^{11}$, $X^{15}$, $X^{19}$, $X^{23}$, and $X^{26}$ so as to output a random number of one byte, any eight terms may be selected from the 13 terms $X^1$, $X^2$, $X^4$, $X^5$, $X^7$, $X^8$, $X^{10}$, $X^{11}$, $X^{12}$, $X^{16}$, $X^{22}$, $X^{23}$ and $X^{26}$.

In a case where a random number is generated by the linear feedback shift register 1, an initial value is set to each of the registers 2. Then, the initial value of each register 2 is shifted to the next register every cycle. In this way, eight random numbers can be obtained from one linear feedback shift register 1 every cycle. At this time, by obtaining the XOR calculation result output by each XOR circuit 3 as a random number, randomness of the numbers can be ensured further even in a case where a plurality of random numbers is output from one linear feedback shift register 1.

The degree n of the linear feedback shift register is preferably selected such that a period Y of the random number generated by the linear feedback shift register is larger than a block size S of a NAND memory. In such a case, data are less likely to be written into particular blocks of the NAND memory. For this reason, interference between memory cells of a same block of the NAND memory does is less likely to occur, and reliability of the NAND memory can be improved.

Figure 2:
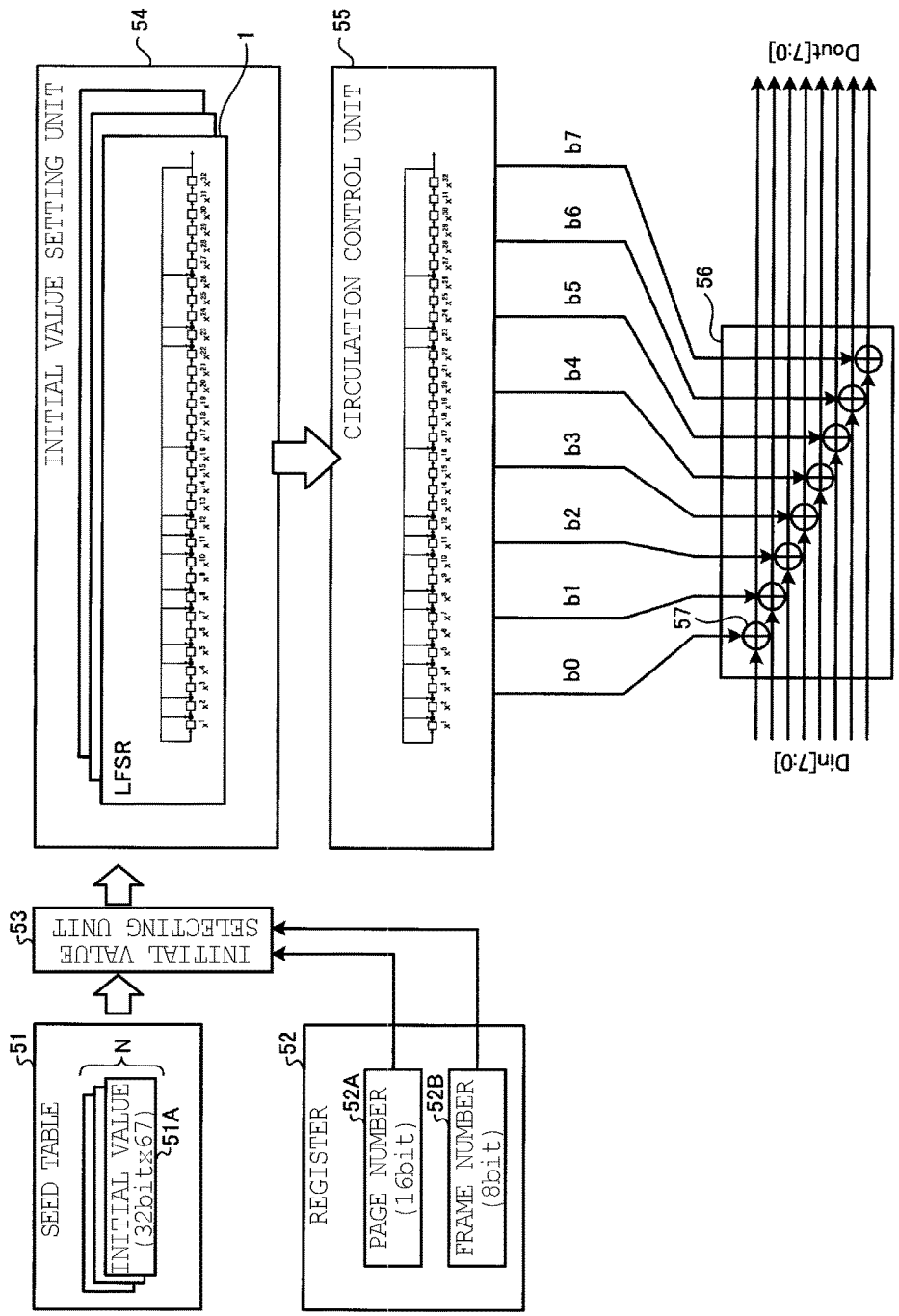
FIG. 2 is a block diagram of a randomization processing device including the random number generation circuit illustrated in FIG. 1.

FIG. 2 is a block diagram of a randomization processing device including the random number generation circuit illustrated in FIG. 1. As illustrated in FIG. 2, the randomization processing device includes a plurality of seed tables 51, a register 52, an initial value selecting unit (circuit) 53, an initial value setting unit (circuit) 54, a circulation control unit (circuit) 55, and a scrambling circuit 56. N (here, N is an integer of two or more) seed tables 51 may be provided. Each seed table 51 can maintain correspondence between indices and initial values 51A. Here, each of the indices is a number that specifies an initial value 51A. At this time, the number P of initial values 51A stored in each seed table 51 is preferably a prime number that is less likely to have correlation with the physical arrangement of cells I. In the register 52, a page number 52A and a frame number 52B of the NAND memory are maintained. Here, a page is a unit for reading or a unit for writing data in the NAND memory. In addition, a frame is a data unit processed by (hereinafter, referred to as an ECC unit) an error correcting code (ECC) circuit used along with the NAND memory.

The initial value selecting unit 53 calculates an index based on the page number 52A and the frame number 52B and obtains an initial value 51A corresponding to the index from the seed table 51. The initial value setting unit 54 sets the obtained initial value 51A to the linear feedback shift register 1. Here, N linear feedback shift registers 1 may be provided in the initial value setting unit 54. The circulation control unit 55 shifts the value each register of the linear feedback shift register 1 by one bit every cycle. The scrambling circuit 56 randomizes input data Din[7:0] based on register outputs b0 to b7 output from the linear feedback shift register 1. In the scrambling circuit 56, an XOR circuit 57 is provided for each bit of the input data Din[7:0]. Each of the XOR circuits 57 calculates XOR of one bit of the input data Din[7:0] and one of the shifted register outputs b0 to b7.

When the input data Din[7:0] is randomized, the page number 52A and the frame number 52B in which the input data Din[7:0] are to be written are stored in the register 52. Then, an index is calculated based on the page number 52A and the frame number 52B. Then, an initial value 51A corresponding to the index is selected from the seed table 51 by using the index as a key and is set in the linear feedback shift register 1. When the index is denoted as "Index," the page number 52A is denoted as "shiftnum," the frame number 52B is denoted as "offset," and the number of ECC units per page is denoted as "frame_max," the following Equation (1) may be satisfied.

$$\text{Index} = \text{shiftnum} \times \text{frame\_max} + \text{offset} \quad (1)$$

Figures 6A, 6B:
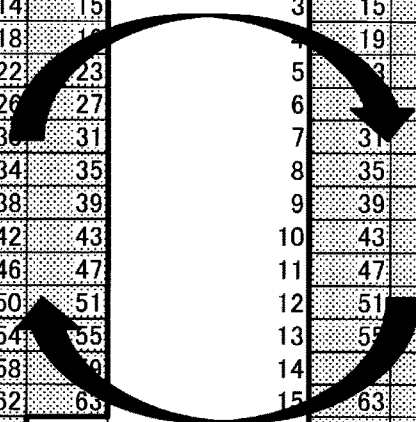
FIGS. 6A and 6B illustrate a seed table to explain a method of changing indices of the seed table.

The content of the seed table 51 that satisfies this Equation (1) is illustrated in FIG. 6A. The content of FIG. 6A can be used as a default.

When the initial value 51A is set in the linear feedback shift register 1, the register outputs b0 to b7 of the linear feedback shift register 1 are shifted by one bit each input cycle of the input data Din[7:0], and the shifted register outputs b0 to b7 at each cycle are output from the linear feedback shift register 1 and input to the scrambling circuit 56. In the scrambling circuit 56, by calculating XOR of each bit of the input data Din[7:0] and corresponding one of the register outputs b0 to b7, output data Dout[7:0] as a randomized value of the input data Din[7:0].

According to the present embodiment, by changing the input data using the initial value 51A obtained based on the page number 52A and the frame number 52B using the linear feedback shift register 1, even if same data are written into a same page or a same frame after data in the page or frame is erased, data written into the same page or frame can be changed to a different value. For this reason, a same value is less likely to be repeatedly written into the same page or frame of the NAND memory many times, and degradation of the reliability of the NAND memory can be suppressed.

FIG. 3 illustrates an example of the content of the seed table used along with the random number generation circuit illustrated in FIG. 1. In FIG. 3, the initial value 51A is represented as a hexadecimal number of a case where the initial value 51A is configured as 32 bits. In FIG. 3, 67 initial values 51A are stored in the seed table. Here, 67 is a prime number. An index is associated with each initial value 51A. The index can be used for designating an initial value 51A. It is preferable that intervals of the bit numbers between initial values 51A are equal.

Here, by setting the number P of initial values 51A stored in each seed table 51 to be a prime number, a period of data allocation between pages, columns, or layers of the NAND memory is less likely to coincide with a period of the initial values 51A. For this reason, the periods of data between adjacent pages, adjacent columns, or adjacent layers of the NAND memory can be made different from each other, and interferences between memory cells of the NAND memory can be suppressed.

In addition, by setting the intervals of bit numbers between the initial values 51A to be equal, a minimum interval of bit numbers between the initial values 51A can be large. For this reason, even when the initial value 51A to be set to the linear feedback shift register 1 is changed, random numbers generated by the linear feedback shift register 1 before and after the change of the initial value 51A are less likely to overlap each other.

When the number of initial values that are set in the seed table 51 is P, it is preferable to satisfy a condition of Y/P>S. For example, it is assumed that the block size S of the NAND memory is about 4M bytes to 6M bytes. At this time, the number P of initial values that are set in the seed table 51 is assumed to be 67. In such a case $Y/P = (2^{32}-1)/67 \approx 8M$ bytes, and the condition of Y/P>S is satisfied. As a result, the period of data writing into the blocks of the NAND memory can be set to be equal to or more than the block size S, and interference between cells in a block of the NAND memory becomes less likely to occur.

Further, it is more preferable that the number of initial values P is a prime number proximate to $2^z$ ($4<z\leq10$), in particular $2^z\pm3$. If z is equal to or smaller than 4, it is more likely that a same initial number is repeatedly used for different addresses. If z is greater than 10, the size of the seed table 51 would become large, and thus a large storage space has to be spared for the seed table 51. Further, as the NAND memory is typically structurally and logically configured in accordance with exponentiations of two, the number of initial values P that is proximate to exponentiations of two would have a larger common multiple, which leads to fewer repetition of same initial values for different addresses.

Figure 4:
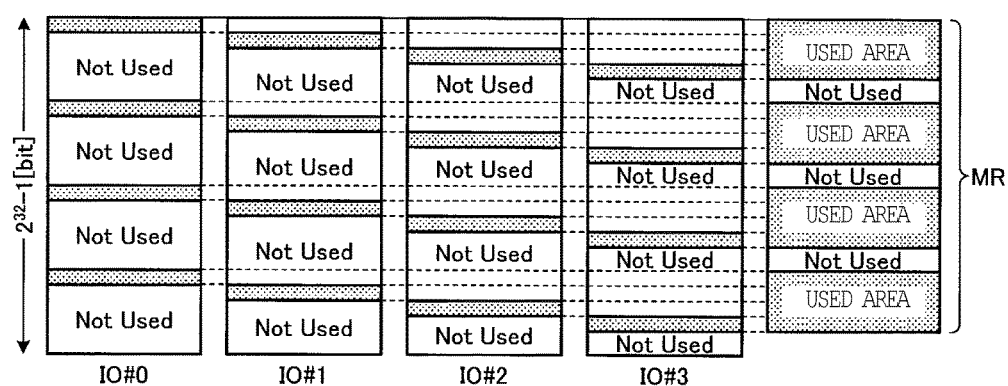
FIG. 4 illustrates an example of a use area of NAND memory when an initial value is changed for each input/output.

FIG. 4 schematically illustrates an example of a use area of the NAND memory when an initial value is changed for each input/output. In FIG. 4, it is assumed that there is a memory area MR of bits of one period $Y=2^{32}-1$ or less. In the memory area MR, there may be both used areas and non-used areas. In addition, the number N of seed tables 51 and the number N of linear feedback shift registers 1 are assumed as N=4. In such a case, four seed tables 51 can be set for four inputs/outputs IO#1, IO#2, IO#3, IO#4 of the memory area MR. Also, the four seed tables 51 can be associated with four linear feedback shift registers 1, respectively.

Then, four initial values are selected from the four seed tables 51 for the inputs/outputs IO#1, IO#2, IO#3, and IO#4, and the four linear feedback shift registers 1 are operated. In such a case, four pieces of input data Din[7:0] can be randomized per cycle. In addition, by preparing four seed tables 51 for the four inputs/outputs IO#1, IO#2, IO#3, and IO#4, even in a case where there is an unused area in each of the inputs/outputs IO#1, IO#2, IO#3, and IO#4, a longest period of the linear feedback shift register 1 can be used, and the randomness of the output data Dout[7:0] can be improved.

(Second Embodiment)

In the randomization processing device according to the first embodiment, the correspondence between parameters used for classifying memory cells of the NAND memory and the initial values is fixed. The parameters described here include a page, a frame, a column, and a layer. The column is an input/output unit of the NAND memory. In such a case, for example, eight bit lines can be assigned per column. The layer represents a layer in which the memory cell is provided when memory cells are stacked.

Figure 5:
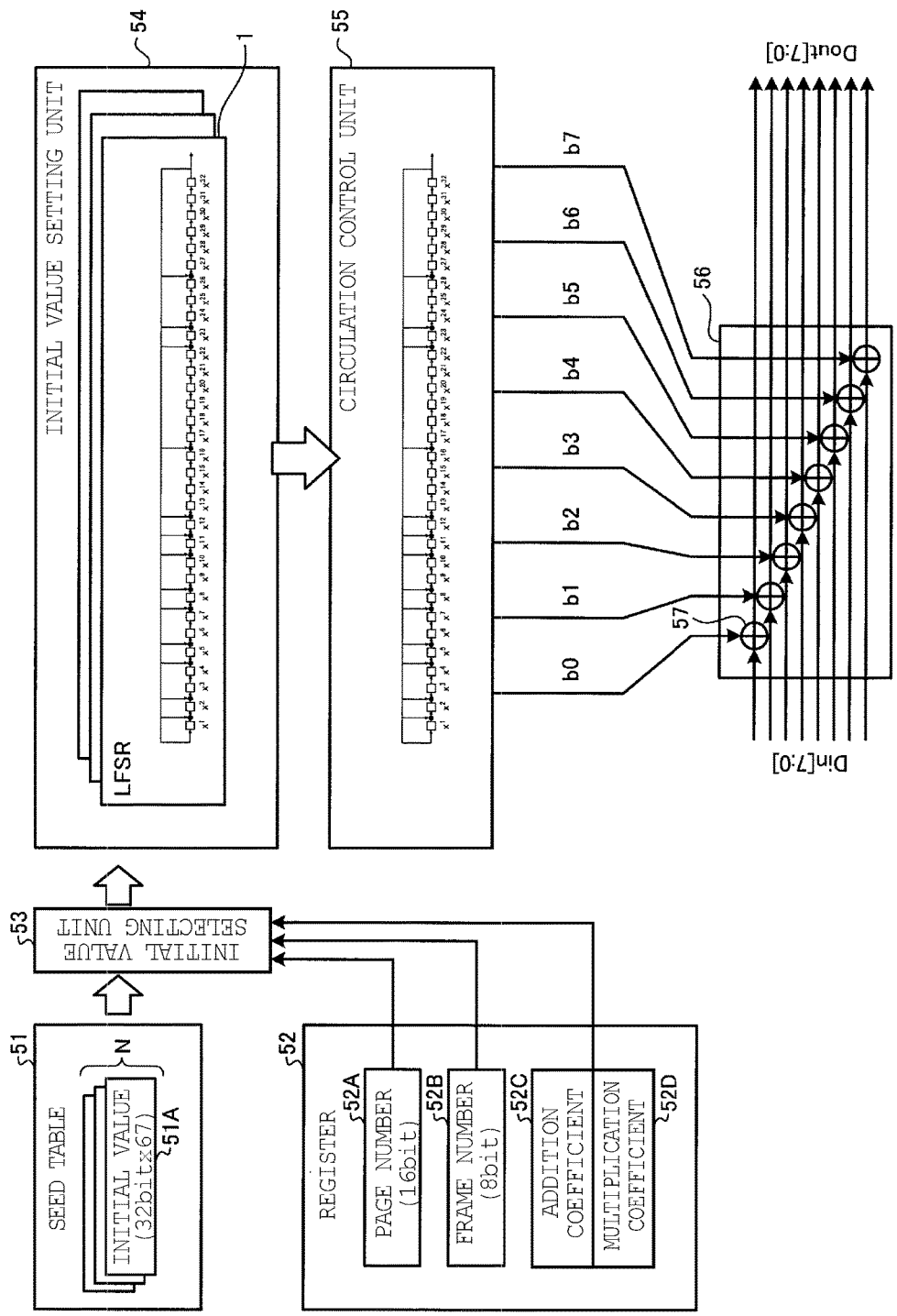
FIG. 5 is a block diagram of a randomization processing device according to a second embodiment.

In contrast, according to a randomization processing device according to a second embodiment, the correspondence between parameters used for classifying memory cells of the NAND memory and initial values is changeable. FIG. 5 is a block diagram of the randomization processing device according to the second embodiment. In the following embodiment, it is assumed that the parameters used for classifying memory cells of the NAND memory include a page and a frame.

The configuration of the randomization processing device illustrated in FIG. 5 is almost the same as the configuration of the randomization processing device illustrated in FIG. 2. However, a register 52 of the present embodiment further maintains an addition coefficient 52C for a frame number 52B and a multiplication coefficient 52D for a page number 52A. As a result, an initial value selecting unit 53 can change the correspondence between an index and the frame number 52B by adding the addition coefficient 52C to the frame number 52B and can change the correspondence between an index and a page number 52A by multiplying the page number 52A by the multiplication coefficient 52D. For example, when the addition coefficient 52C is Remap_ofst, the index Index can be expressed by the following Equation (2).

$$\text{Index}=\text{shiftnum}\times\text{frame\_max}+\text{offset}+\text{Remap\_ofst} \quad (2)$$

In addition, when the multiplication coefficient 52D is Remap_Num, the index Index can be expressed by the following Equation (3).

$$\text{Index}=\text{Index}+\text{shiftnum}\times\text{Remap\_Num} \quad (3)$$

Then, an initial value 51A corresponding to the changed index is selected from a seed table 51 and set in the linear feedback shift register 1. Here, the conversion equation of the index Index is not limited to Equation (2) and (3) but may be any conversion equation that can be used for breaking the periodicity of the seed table 51.

According to the present embodiment, by configuring the correspondence between the parameters used for classifying memory cells and the initial values to be changeable, even if a page, a frame, a column, or a layer is changed according to a design change of the NAND memory, the periodic relation of data stored in the NAND memory can be broken. For this reason, even if there is a design change of the NAND memory, the periodicity of data written into a same block of the NAND memory can be prevented, and interference between memory cells becomes less likely to occur in a same block of the NAND memory.

FIGS. 6A and 6B illustrate a seed table used along with the random number generation circuit illustrated in FIG. 5 to explain a method of changing indices of the seed table. In the seed table 51, the vertical axis represents the page number "shiftnum," and the horizontal axis represents the frame number "offset," and an "Index" specified by the page number "shiftnum" and the frame number "offset" is registered. In FIG. 6A, the seed table 51 has a default setting according to Equation (1). Equation (1) corresponds to a case of Remap_ofst=0 in Equation (2).

When Remap_ofst=3 is set in Equation (2), as illustrated in FIG. 6B, "Index" is shifted by three in the seed table 51. For this reason, "Index" specified by the page number "shiftnum" and the frame number "offset" can be changed.

FIGS. 7A and 7B illustrate a method of changing a mapping area of indices of the seed table applied used along with the random number generation circuit illustrated in FIG. 5. In FIG. 7A, when "Remap_Num=1" is set in Equation (3), the mapping area of the index Index is changed from the mapping area illustrated in FIG. 6A. In such a case, the mapping area, as illustrated in FIG. 7A, extends in the direction in which shiftnum increases in the column of offset=1.

In FIG. 7B, when "Remap_Num=2" is set in Equation (3), the mapping area of the index Index is changed from the mapping area illustrated in FIG. 6A. In such a case, the mapping area, as illustrated in FIG. 7B, extend in the direction in which shiftnum increases in the column of offset=0.

(Third Embodiment)

Figure 8:
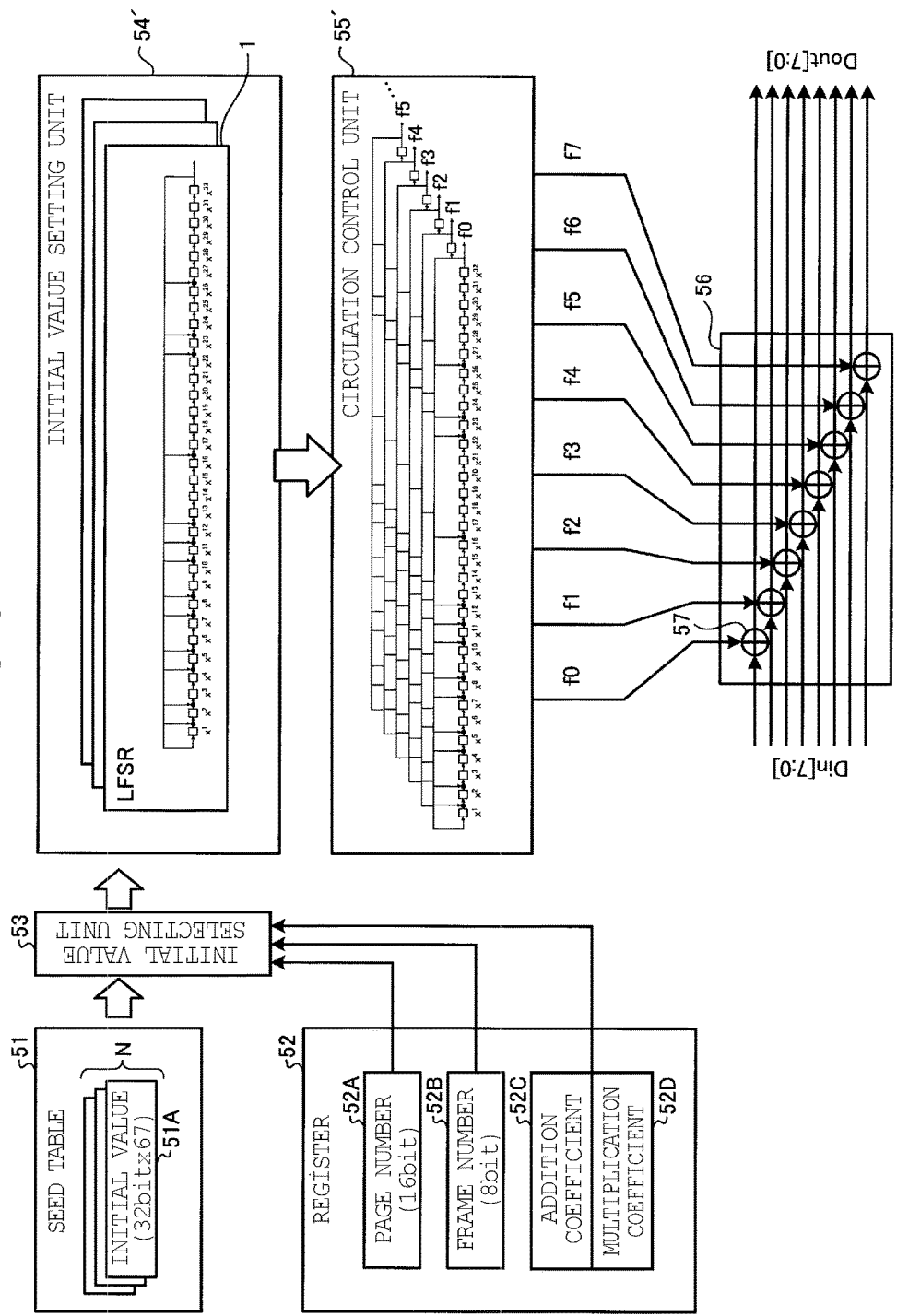
FIG. 8 is a block diagram of a randomization processing device according to a third embodiment.

FIG. 8 is a block diagram of a randomization processing device according to a third embodiment. In the randomization processing device illustrated in FIG. 8, in place of the initial value setting unit 54 and the circulation control unit 55 illustrated in FIG. 5, an initial value setting unit 54' and a circulation control unit 55' are provided. The configuration of the randomization processing device illustrated in FIG. 8 is the same as the configuration of the randomization processing device illustrated in FIG. 5 other than that. In the circulation control unit 55 illustrated in FIG. 5, register outputs b0 to b7 of one byte are input from one linear feedback shift register 1 as a random number every cycle. In contrast, in the circulation control unit 55' illustrated in FIG. 8, a register output of one bit is input from each of linear feedback shift registers 1 as a random number every cycle. In such a case, in order to acquire a random number of one byte every cycle, eight linear feedback shift registers 1, which are configured differently from each other, may be provided.

In the initial value setting unit 54', an initial value is set to eight linear feedback shift registers 1. Then, in the circulation control unit 55', the values of the eight linear feedback shift registers 1 are shifted by one bit each input cycle of input data Din[7:0], and register outputs f0 to f7 of the last stage of each linear feedback shift register 1 are input from each linear feedback shift register 1 to a scrambling circuit 56. In the scrambling circuit 56, XOR of each bit of the input data Din[7:0] and corresponding one of the register outputs f0 to f7 is calculated, and output data Dout[7:0] is generated as randomized input data Din[7:0].

Here, the initial value selecting unit 53 can configure correspondence between parameters used for classifying memory cells and initial values to be changeable. For this reason, since the register outputs f0 to f7 of the eight linear feedback shift registers 1 are used as random numbers, the periodicity of data written into a same block of the NAND memory can be broken even if even there is a design change of the NAND memory.

(Fourth Embodiment)

Figure 9:
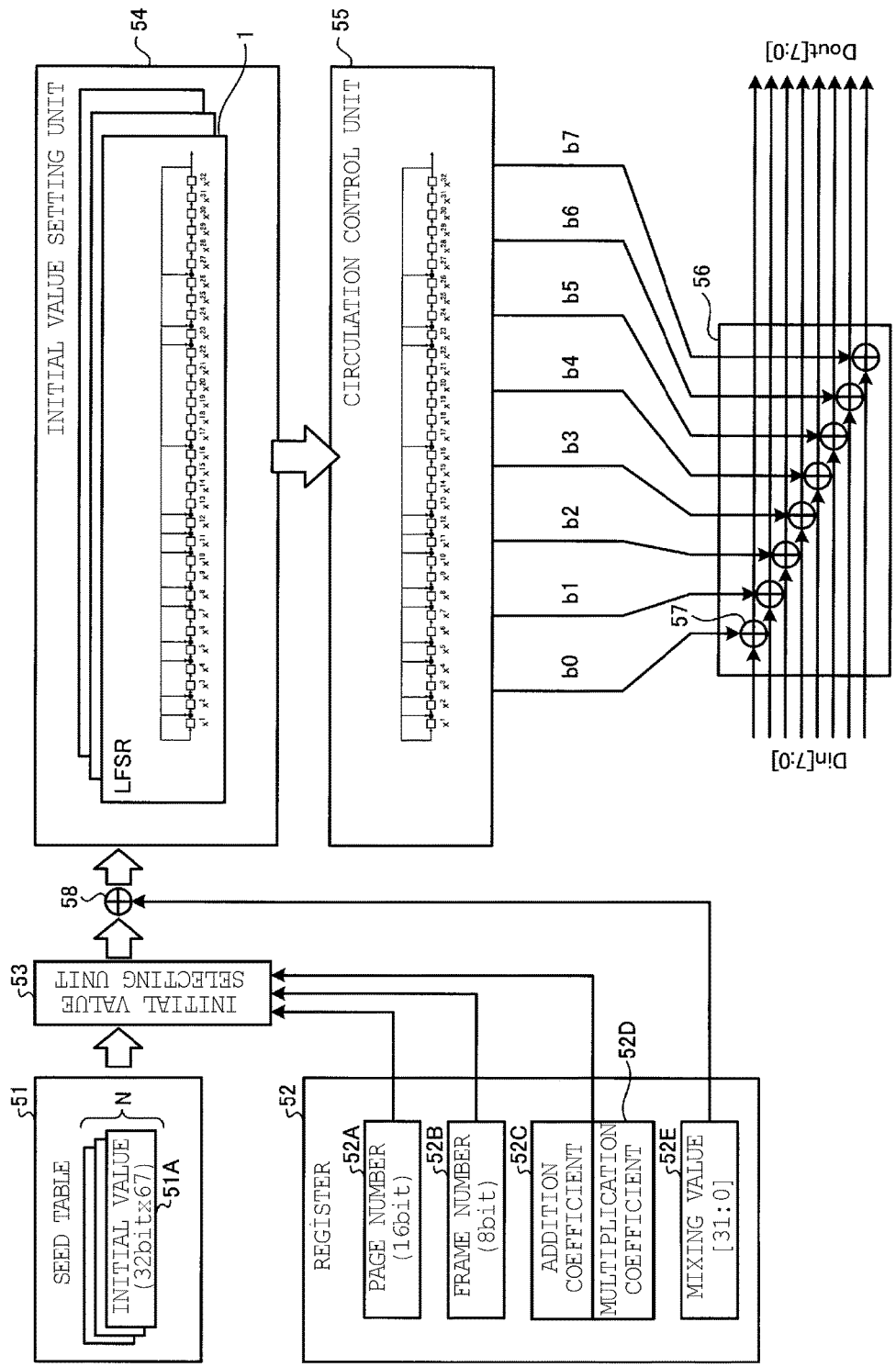
FIG. 9 is a block diagram of a randomization processing device according to a fourth embodiment.

FIG. 9 is a block diagram of a randomization processing device according to a fourth embodiment. The randomization processing device illustrated in FIG. 9 further maintains a mixing value 52E in a register 52. In addition, an XOR circuit 58 is added to the components of the randomization processing device illustrated in FIG. 5. The other configuration of the randomization processing device illustrated in FIG. 9 is similar to the configuration of the randomization processing device illustrated in FIG. 5. The XOR circuit 58 calculates XOR of an initial value 51A and the mixing value 52E for each bit. If the initial value 51A is configured of 32 bits, the mixing value 52E is configured of 32 bits.

Then, when an initial value 51A is selected by the initial value selecting unit 53, XOR of the initial value 51A and the mixing value 52E is calculated by the XOR circuit 58 and output to the initial value setting unit 54. The XOR calculation result calculated by the XOR circuit 58 is set as the initial value of the linear feedback shift register 1 by the initial value setting unit 54.

According to the present embodiment, by calculating XOR of the initial value 51A and the mixing value 52E, the initial value 51A can be mixed with the mixing value 52E. For this reason, randomness of the register outputs b0 to b7 output from the linear feedback shift register 1 can be improved.

(Fifth Embodiment)

Figure 10:
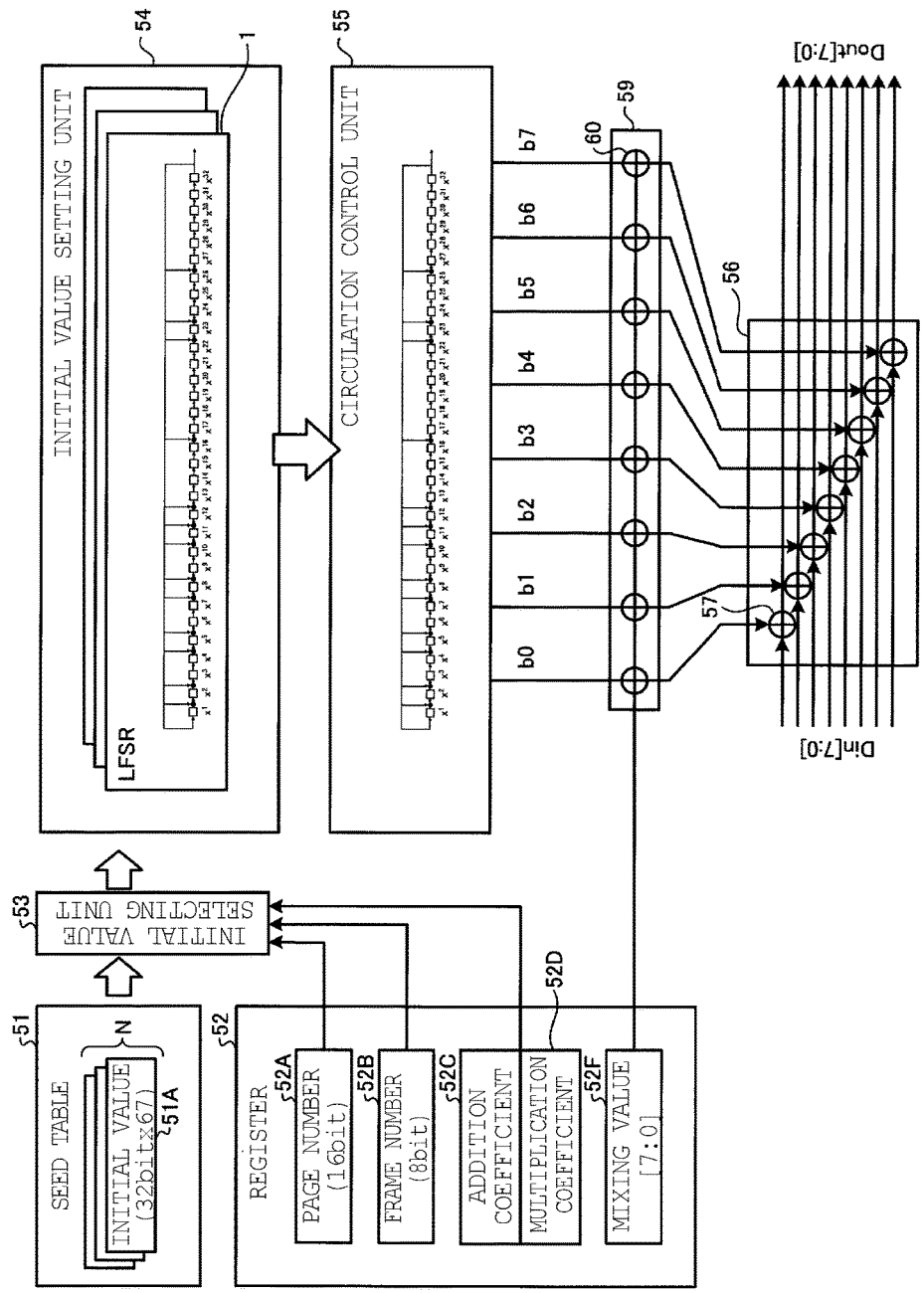
FIG. 10 is a block diagram of a randomization processing device according to a fifth embodiment.

FIG. 10 is a block diagram of a randomization processing device according to a fifth embodiment. The randomization processing device illustrated in FIG. 10 further maintains a mixing value 52F in a register 52. In addition, a mixing circuit 59 is added to the components of the randomization processing device illustrated in FIG. 5. The other configuration of the randomization processing device illustrated in FIG. 10 is similar to the configuration of the randomization processing device illustrated in FIG. 5. The mixing circuit 59 mixes the register outputs b0 to b7 output from a linear feedback shift register 1. In the mixing circuit 59, an XOR circuit 60 is provided for each bit of the register outputs b0 to b7. The XOR circuit 60 calculates XOR of one of the register outputs b0 to b7 and the mixing value 52F for each bit. When the register output b0 to b7 are configured of eight bits, the mixing value 52F can be configured of eight bits.

When an initial value 51A is set in a linear feedback shift register 1, the values set in the linear feedback shift register 1 are shifted by one bit each input cycle of input data Din[7:0], and the register outputs b0 to b7 at that time are output from the linear feedback shift register 1 and input to the mixing circuit 59. In the mixing circuit 59, XOR of each bit of the register outputs b0 to b7 and the mixing value 52F is calculated and is input to a scrambling circuit 56. In the scrambling circuit 56, by calculating XOR of each bit of the input data Din[7:0] and corresponding bit of the XOR calculation result calculated by the mixing circuit 59, output data Dout[7:0] is generated as randomized input data Din[7:0].

According to the present embodiment, by calculating XOR of each bit of the register outputs b0 to b7 and the mixing value 52F, the register outputs b0 to b7 are mixed with the mixing value 52F. For this reason, the randomness of the random number used for the randomization of input data Din[7:0] can be improved. In addition, the mixing function illustrated in FIG. 9 or 10 may be applied to the configuration illustrated in FIG. 8.

(Sixth Embodiment)

Figure 11:
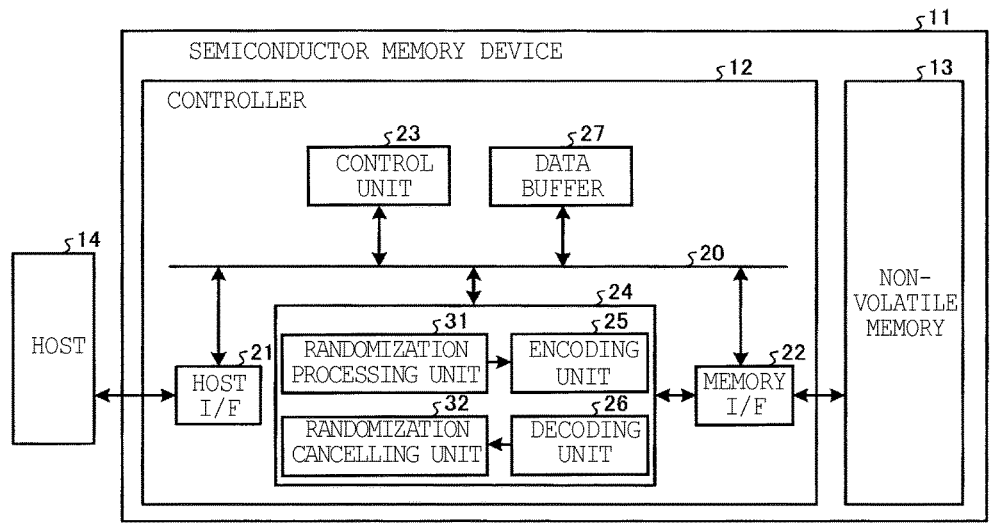
FIG. 11 is a block diagram of a semiconductor memory device according to a sixth embodiment.

FIG. 11 is a block diagram of a semiconductor memory device according to a sixth embodiment. As illustrated in FIG. 11, a semiconductor memory device 11 includes a controller 12 and a nonvolatile memory 13. The semiconductor memory device 11 is connectable to a host 14. Here, the host 14, for example, is an electronic device such as a personal computer or a mobile terminal.

The nonvolatile memory 13 is a semiconductor memory that stores data in a nonvolatile manner and, for example, is a NAND memory. The NAND memory can write or read data in unit of page. In the NAND memory, data can be erased in unit of block. Each memory cell of the NAND memory may be a single cell that can store one bit or a multi-level cell that can store two or more bits.

The controller 12 controls data writing in the nonvolatile memory 13 in accordance with a write command from the host 14. The controller 12 controls data reading from the nonvolatile memory 13 in accordance with a read command from the host 14. The controller 12 includes a Host I/F 21, a memory I/F 22, a control unit 23, an ECC unit 24, and a data buffer 27. The Host I/F 21, the memory I/F 22, the control unit 23, the ECC unit 24, the data buffer 27 are connected to each other through an internal bus 20. The Host I/F 21 outputs commands, user data (write data), and the like received from the host 14 to the internal bus 20. In addition, the Host I/F 21 transmits user data (read data) read from the nonvolatile memory 13, responses from the control unit 23, and the like to the host 14. The memory I/F 22 controls a process of writing user data and the like into the nonvolatile memory 13 and a process of reading the user data and the like from the nonvolatile memory 13 based on instructions from the control unit 23.

The control unit 23 controls the entire semiconductor memory device 11. The control unit 23, for example, is a central processing unit (CPU), a micro processing unit (MPU), or the like. When a command is received from the host 14 through the Host I/F 21, the control unit 23 performs control according to the command. For example, the control unit 23 instructs the memory I/F 22 to write user data into the nonvolatile memory 13 in accordance with the command from the host 14. The control unit 23 instructs the memory I/F 22 to read user data from the nonvolatile memory 13 in accordance with the command from the host 14. The control unit 23 determines a memory area of the nonvolatile memory 13 in which the user data stored in the data buffer 27 are to be written. The user data are stored in the data buffer 27 through the internal bus 20. The control unit 23 instructs the memory I/F 22 to write the user data into the determined memory area of the nonvolatile memory 13. When a read command is received from the host 14, the control unit 23 instructs the memory I/F 22 to read user data from an address of the nonvolatile memory 13, which is included in the read command.

The ECC unit 24 includes an encoding unit 25, a decoding unit 26, a randomization processing unit 31, and a randomization cancelling unit 32. The randomization processing unit 31 randomizes user data of a predetermined size that is to be written on a page of the nonvolatile memory 13 and transmits the randomized user data to the encoding unit 25. The encoding unit 25 encodes the randomized user data. The decoding unit 26 decodes user data of a predetermined size read from a page of the nonvolatile memory 13 and transmits decoded user data to the randomization cancelling unit 32. The randomization cancelling unit 32 cancels the randomization of the randomized user data. The randomization processing unit 31 may have one of the configurations illustrated in FIGS. 2, 5, 8, and 9. The randomization cancelling unit 32 may be configured in a similar manner as the randomization processing unit 31.

The data buffer 27 temporarily stores user data received from the host 14 until the user data are written in the nonvolatile memory 13 or temporarily stores data read from the nonvolatile memory 13 until the data are transmitted to the host 14. As the data buffer 27, for example, a volatile memory such as a static random access memory (SRAM) or a dynamic random access memory (DRAM) may be used.

In general, data overwriting cannot be performed with respect to NAND memory. For this reason, when data are written in unit of page, data stored in a block are copied to an external space once, and then the data in the block are erased. Then, current data are written and the data externally stored are written in the block.

At this time, for example, according to the configuration illustrated in FIG. 2, the initial value 51A of the linear feedback shift register 1 can be changed when data are newly written into a predetermined area of the block and when the data is written again into the predetermined area. For this reason, a same value is less likely to be repeatedly written into a same cell of the NAND memory, and the degradation of the reliability of the NAND memory can be suppressed.

Figure 12:
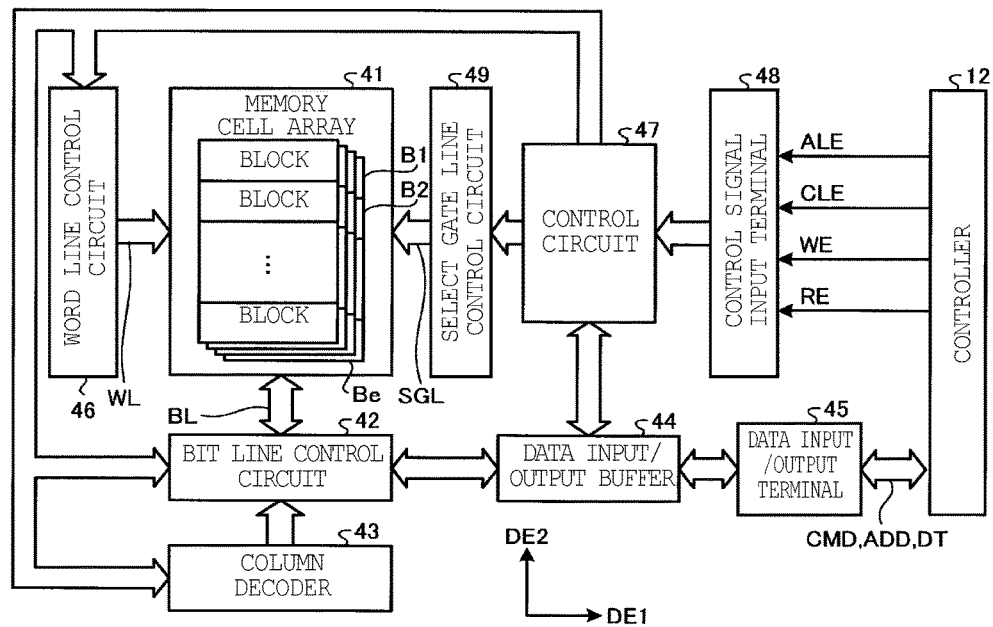
FIG. 12 is a block diagram of a nonvolatile memory of the semiconductor memory device illustrated in FIG. 11.

FIG. 12 is a block diagram of the nonvolatile memory illustrated in FIG. 11. As illustrated in FIG. 12, in a memory cell array 41, memory cells are three-dimensionally arranged. The memory cell array 41 includes a plurality of bit lines BL, a plurality of word line WL, and a plurality of select gate lines SGL. Each bit line BL can select memory cells in a row direction DE1. Each select gate line SGL can select memory cells in a column direction DE2. Each word line WL can select a layer of memory cells. The memory cell array 41 is divided into e (here, e is a positive integer) blocks B1 to Be. Each of the blocks B1 to Be includes a plurality of NAND cell units arranged in the row direction DE1 and the column direction DE2. In a NAND cell unit, memory cells connected in series are stacked. A bit line control circuit 42 that controls the bit lines BL, a word line control circuit 46 that controls the word lines WL, and a select gate line control circuit 49 that controls the select gate lines SGL are connected to the memory cell array 41.

The bit line control circuit 42 reads data of a memory cell included in the memory cell array 41 through the bit line BL, detects the state of a memory cell included in the memory cell array 41 through the bit line BL, or writes data into a memory cell by applying a write control voltage to the memory cell included in the memory cell array 41 through the bit line BL. A column decoder 43 and a data input/output buffer 44 are connected to the bit line control circuit 42. A data memory circuit included in the bit line control circuit 42 is selected by the column decoder 43. The data of the memory cell that are read and transferred to the data memory circuit are output from a data input/output terminal 45 to the controller 12 through the data input/output buffer 44. Various commands CMD used for controlling the operation of the NAND memory, an address ADD, and data DT supplied from the controller 12 are input to the data input/output terminal 45. The write data input to the data input/output terminal 45 is supplied to a data memory circuit selected by the column decoder 43 through the data input/output buffer 44, and the command CMD and the address ADD are supplied to the control circuit 47.

The word line control circuit 46 selects a word line WL included in the memory cell array 41 and applies a voltage that is required for reading, writing, or erasing data to the selected word line WL. The select gate line control circuit 49 selects a select gate line SGL included in the memory cell array 41 and applies a voltage required for reading, writing, or erasing data to the selected select gate line SGL.

The memory cell array 41, the bit line control circuit 42, the column decoder 43, the data input/output buffer 44, the word line control circuit 46, and the select gate line control circuit 49 are connected to the control circuit 47 and is controlled by the control circuit 47. The control circuit 47 is connected to a control signal input terminal 48 and is controlled in accordance with control signals address latch enable (ALE), command latch enable (CLE), write enable (WE), and read enable (RW) that are input from the outside through the control signal input terminal 48.

Figure 13:
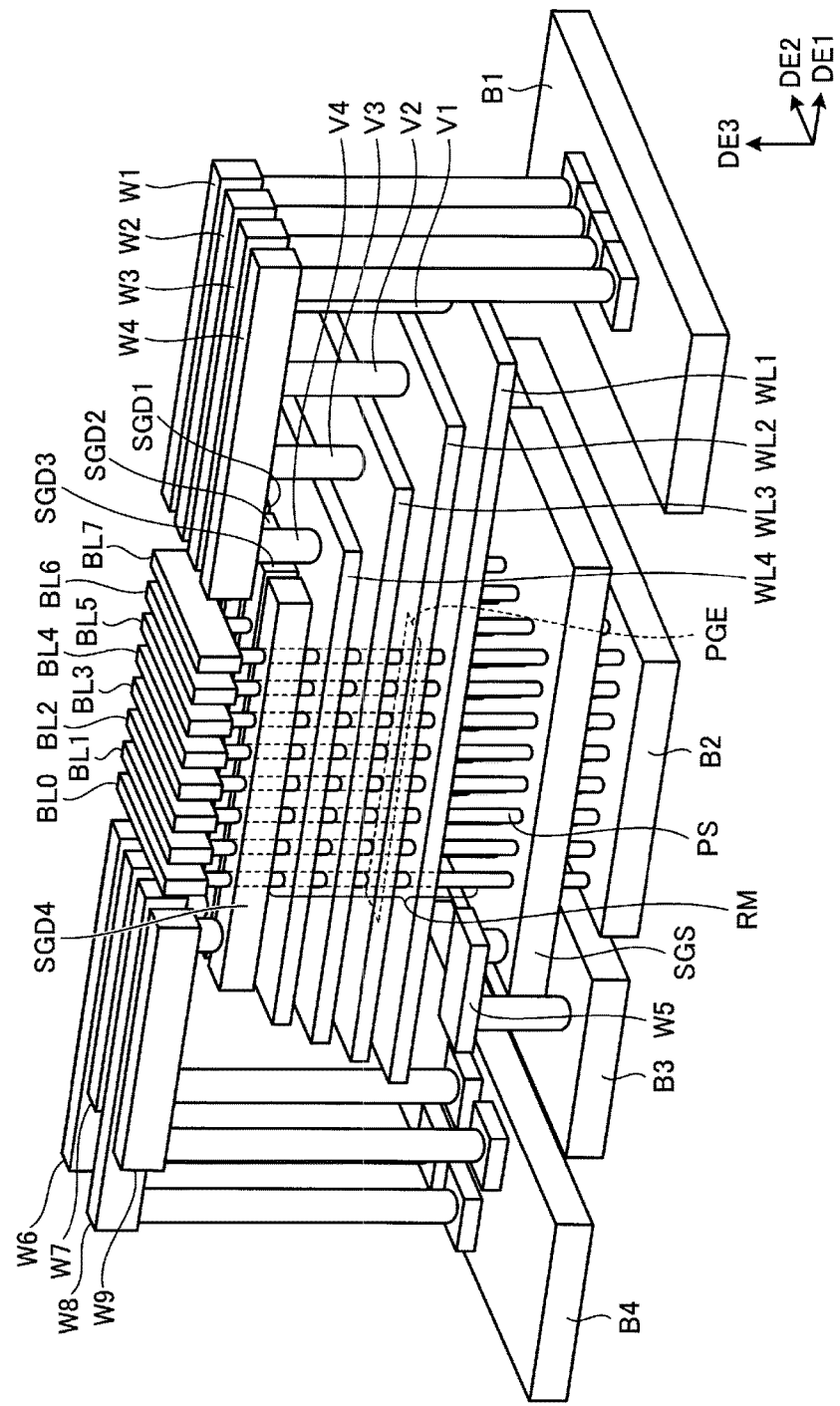
FIG. 13 is a perspective view of a schematic configuration of the nonvolatile memory illustrated in FIG. 12.

FIG. 13 is a perspective view of a schematic configuration of the nonvolatile memory illustrated in FIG. 12. In FIG. 13, it is assumed that in one block, word lines WL are stacked in four layers, eight bit lines BL are provided, and four drain-side select gate lines SGD are provided.

In FIG. 13, the nonvolatile memory 13 has a cell array area RM. In the cell array area RM, word lines WL1 to WL4 are sequentially stacked in a stacking direction DE3, whereby a three-dimensional structure body is configured. Then, a pillar-shaped body PS passes through the word lines WL1 to WL4, memory cells are formed at intersections between the pillar-shaped body PS and the word lines WL1 to WL4. The pillar-shaped body PS includes a memory region to store data. As the memory region, for example, a charge-trap layer formed of SiN or the like may be used. Each pillar-shaped body PS corresponds to a plurality of NAND cells. By two-dimensionally arranging a plurality of pillar-shape bodies PS in the row direction DE1 and the column direction DE2, the memory cells are three-dimensionally arranged in the cell array area RM. In FIG. 13, eight memory cells are arranged in the row direction DE1, four memory cells are arranged in the column direction DE2, and four memory cells are arranged in the stacking direction DE3. The word lines WL1 to WL4 may be shared by memory cells of a same layer. A source-side gate line SGS is provided below the cell array area RM. Drain-side select gate lines SGD1 to SGD4 are provided on the cell array RM. The drain-side select gate lines SGD1 to SGD4 can be separated for each row. A page PGE is configured using memory cells belonging to a same layer and a same row. In FIG. 13, eight memory cells are provided on one page.

A source layer B2 is provided under the source-side select gate line SGS. A word line driving circuit B1, a source-side select gate line driving circuit B3, and a drain-side select gate line driving circuit B4 are arranged in parallel to the source layer B2. The word line driving circuit B1, the source layer B2, the source-side select gate line driving circuit B3, and the drain-side select gate line driving circuit B4 are formed on a semiconductor substrate.

On the source-side select gate line SGS, a lead-out wire W5 is formed. The source-side select gate line SGS is connected to the source-side select gate line driving circuit B3 through the lead-out wire W5. On the drain-side select gate lines SGD1 to SGD4, bit lines BL0 to BL7 are formed in the column direction DE2. The bit lines BL0 to BL7 can be shared by the blocks B1 to Be illustrated in FIG. 12. In addition, on the drain-side select gate lines SGD1 to SGD4, lead-out wires W6 to W9 are formed in the row direction DE1. The drain-side select gate lines SGD1 to SGD4 are connected to the drain-side select gate line driving circuit B4 through the lead-out wires W6 to W9, respectively. One ends of the word lines WL1 to WL4 in the row direction DE1 have a stair shape. At one ends of the word lines WL1 to WL4 in the row direction DE1, a word line of a lower layer is exposed between word lines of an upper layer. On the word lines WL1 to WL4, lead-out wires W1 to W4 are formed in the row direction DE1. The word lines WL1 to WL4 are connected to the lead-out wires W1 to W4, respectively, through contact plugs V1 to V4, respectively. The lead-out wires W1 to W4 are connected to the word line driving circuit B1.

By selecting one of the word lines WL1 to WL4 and one of the drain-side select gate lines SGD1 to SGD4, one page PGE can be selected. When data are written in the selected page PGE, the output data Dout[7:0] illustrated in FIG. 2 is transmitted from the randomization processing unit 31 illustrated in FIG. 11 to the encoding unit 25. Then, encoded data coded by the encoding unit 25 is input to the data input/output terminal 45 as data DT illustrated in FIG. 12. By controlling the electric potential of the bit lines BLO to BL7 in accordance with the data DT, the data are written into the selected page.

Here, in the configuration illustrated in FIG. 13, a page specified by the word line WL1 and the drain-side select gate line SGD4 and a page specified by the word line WL2 and the drain-side select gate line SGD1 are separate from each other. For this reason, when the same initial value 51A for the two pages is set to the linear feedback shift register 1, even if the periods of data of the two pages coincide with each other, interference between the memory cells of the two pages is less likely to occur.

Meanwhile, it is assumed that the design of the configuration illustrated in FIG. 13 is changed, and a drain-side select gate line SGDS is added. A page specified by the word line WL2 and the drain-side select gate line SGD1 before the design change is assumed to be moved to a page specified by the word line WL1 and the drain-side select gate line SGDS after the design change. In such a case, a page specified by the word line WL1 and the drain-side select gate line SGD4 and a page specified by the word line WL1 and the drain-side select gate line SGD5 are adjacent to each other. For this reason, when the same initial value 51A for the two pages is set to the linear feedback shift register 1, the periods of data of the two pages coincide with each other, and interference between memory cells of the two pages becomes more likely to occur.

Here, for example, the randomization processing device illustrated in FIG. 5 is assumed to be used. In that case, the correspondence between parameters used for classifying memory cells and the initial values 51A is changeable. For this reason, the initial value 51A can be set differently between a page specified by the word line WL1 and the drain-side select gate line SGD4 and a page specified by the word line WL1 and the drain-side select gate line SGD5. As a result, interference between memory cells of the two pages becomes less likely to occur. In addition, although the three-dimensional NAND flash memory is described as an example of the NAND memory in the above embodiments, a two-dimensional NAND flash memory may be used instead.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a NAND memory including a plurality of blocks, each of which is a unit of data erasing; and
    a controller configured to
        select an initial value from a group of initial values, based on an address of the NAND memory in which data are to be written,
        set a value corresponding to the selected initial value to a linear feedback shift register circuit,
        randomize the data using an output value of the linear feedback shift register circuit, and
        write the randomized data to the address of the NAND memory, wherein a size of each of the blocks S is smaller than $2^{n-1}$ bytes, n being a number of registers included in the linear feedback shift register circuit.

2. The semiconductor memory device according to claim 1, wherein
    a number P of the initial values included in the group is a prime number and satisfies $2^{n-1}/P > S$.

3. The semiconductor memory device according to claim 1, wherein
    the controller maintains correspondence between the initial values and indices, each of which is associated with at least an address of the NAND memory, and selects the initial value by referring to the correspondence.

4. The semiconductor memory device according to claim 3, wherein
    the controller is configured to shift an index associated with the address of the NAND memory in which the data are to be written, and an initial value corresponding to the shifted index is selected by the controller.

5. The semiconductor memory device according to claim 3, wherein
    each of the block includes a plurality of pages, each of which is a unit of data writing, and
    the controller is configured to change indices associated with addresses of the NAND memory, such that indices of consecutive pages become non-consecutive.

6. The semiconductor memory device according to claim 1, wherein
a plurality of exclusive disjunctions (XOR) of two values output from different two of the registers of the linear feedback shift register circuit is output from the linear feedback shift register circuit, a number of the registers included in the linear feedback shift register circuit being greater than three, and
processing of each bit of the data using one of the exclusive disjunctions is carried out for randomization.

7. The semiconductor memory device according to claim 1, wherein
the value set in the linear feedback shift register circuit is equal to the selected initial value.

8. The semiconductor memory device according to claim 1, wherein
the value set in the linear feedback shift register circuit is a value obtained by processing the selected initial value with a mixing value.

9. The semiconductor memory device according to claim 1, wherein
the output value of the linear feedback shift register circuit is calculated using a mixing value, and the data are randomized using the calculated value.

10. The semiconductor memory device according to claim 1, wherein
the controller sets the value corresponding to the selected initial value to a plurality of linear feedback shift register circuits, and randomizes the data using a plurality of output values that is output from the plurality of linear feedback shift register circuits.

* * * * *